United States Patent
Ando et al.

(10) Patent No.: US 11,818,886 B2
(45) Date of Patent: Nov. 14, 2023

(54) LOW PROGRAM VOLTAGE FLASH MEMORY CELLS WITH EMBEDDED HEATER IN THE CONTROL GATE

(71) Applicant: International Business Machines Corporation, Armonk, NY (US)

(72) Inventors: Takashi Ando, Eastchester, NY (US); Nanbo Gong, White Plains, NY (US); Bahman Hekmatshoartabari, White Plains, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 311 days.

(21) Appl. No.: 17/449,354

(22) Filed: Sep. 29, 2021

(65) Prior Publication Data
US 2023/0097904 A1    Mar. 30, 2023

(51) Int. Cl.
*H10B 41/30* (2023.01)
*G11C 7/04* (2006.01)
*G11C 11/54* (2006.01)
*G11C 16/10* (2006.01)

(52) U.S. Cl.
CPC .............. *H10B 41/30* (2023.02); *G11C 7/04* (2013.01); *G11C 11/54* (2013.01); *G11C 16/10* (2013.01)

(58) Field of Classification Search
CPC .................................................... H10B 41/30
See application file for complete search history.

(56) References Cited

U.S. PATENT DOCUMENTS

| | | | |
|---|---|---|---|
| 6,882,571 B1 | 4/2005 | Look | |
| 6,950,356 B2 | 9/2005 | Tao | |
| 7,411,818 B1 | 8/2008 | Elmegreen | |
| 7,457,180 B2 | 11/2008 | Harris | |
| 7,964,935 B2 | 6/2011 | Kakegawa | |
| 11,631,462 B2 * | 4/2023 | Gong | G11C 11/54 711/100 |
| 2012/0281478 A1 * | 11/2012 | Lue | G11C 16/3495 438/570 |
| 2012/0327719 A1 * | 12/2012 | Lue | G11C 16/349 365/185.23 |
| 2015/0026485 A1 * | 1/2015 | Mostovych | G06F 21/86 713/194 |

(Continued)

OTHER PUBLICATIONS

Patent Cooperation Treaty, Notification of Transmittal of the International Search Report and Written Opinion of the International Searching Authority, App No. PCT EP2022/076747, dated Feb. 15, 2023, 12 pages.

(Continued)

*Primary Examiner* — Douglas King
(74) *Attorney, Agent, or Firm* — Mark Bergner

(57) ABSTRACT

A method of manufacturing a low program voltage flash memory cell with an embedded heater in the control gate creates, on a common device substrate, a conventional flash memory cell in a conventional flash memory area (CFMA), and a neuromorphic computing memory cell in a neuromorphic computing memory area (NCMA). The method comprises providing a flash memory stack in both the CFMA and the NCMA, depositing a heater on top of the flash memory stack in the NCMA without depositing a heater on top of the flash memory stack in the CFMA.

20 Claims, 7 Drawing Sheets

(56) References Cited

U.S. PATENT DOCUMENTS

| | | | |
|---|---|---|---|
| 2016/0071582 A1* | 3/2016 | Chung | G11C 17/18 |
| | | | 365/158 |
| 2016/0071608 A1* | 3/2016 | Bronner | G11C 13/0002 |
| | | | 365/185.18 |
| 2020/0057561 A1* | 2/2020 | Lai | G06F 3/061 |
| 2020/0328254 A1 | 10/2020 | Liao | |
| 2020/0381450 A1 | 12/2020 | Lue | |
| 2021/0134365 A1 | 5/2021 | Lim | |
| 2021/0249081 A1* | 8/2021 | Gong | G11C 16/349 |

OTHER PUBLICATIONS

Dave Fick, "Mythic @ Hot Chips 2018," Aug. 22, 2018, https://medium.com/mythic-ai/mythic-hot-chips-2018-637dfb9e38b7. Retrieved from internet on Aug. 4, 2021.

H. Lue et al., "Radically extending the cycling endurance of Flash memory (to > 100M Cycles) by using built-in thermal annealing to self-heal the stress-induced damage," 2012 International Electron Devices Meeting, 2012, pp. 9.1.1-9.1.4, doi: 10.1109/IEDM.2012. 6479008, https://ieeexplore.ieee.org/abstract/document/6479008.

Mike Demler, "Mythic Multiples in a Flash," Aug. 27, 2018, The Linely Group, Microprocessor Report, https://www.mythic-ai.com/wp-content/uploads/2018/08/Mythic-Multiplies-In-A-Flash.pdf.

N. Takaura et al., "A GeSbTe phase-change memory cell featuring a tungsten heater electrode for low-power, highly stable, and short-read-cycle operations," IEEE International Electron Devices Meeting 2003, 2003, pp. 37.2.1-37.2.4, doi: 10.1109/IEDM.2003. 1269423. https://ieeexplore.ieee.org/document/1269423.

Nanbo Gong, "Temperature Assisted Programming of Flash Memory for Neuromorphic Computing," U.S. Appl. No. 16/785,797, filed Feb. 10, 2020.

Samuel K. Moore, "Two Startups Use Processing in Flash Memory for AI at the Edge" IEEE Spectrum, Aug. 13, 2018, https://spectrum.ieee.org/tech-talk/computing/embedded-systems/two-startups-use-processing-in-flash-memory-for-ai-at-the-edge. Retrieved from internet on Aug. 4, 2021.

* cited by examiner

LOW PROGRAM VOLTAGE FLASH MEMORY CELLS WITH EMBEDDED HEATER IN THE CONTROL GATE

BACKGROUND

The present disclosure relates to flash memory cells, and in particular, to a low program voltage flash memory cell with an embedded heater in the control gate.

Embedded flash memory is a mature technology available from foundries and has been used for many different applications. Such memory is desirable because it can retain its contents even without power. One such application of embedded flash memory is its use in the implementation of neuromorphic computing chips.

SUMMARY

Embodiments of the present disclosure relate to a method of manufacturing a low program voltage flash memory cell with embedded heater in the control gate. The method manufactures, on a common device substrate, a conventional flash memory cell in a conventional flash memory area (CFMA), and a neuromorphic computing memory cell in a neuromorphic computing memory area (NCMA). The method comprises providing a flash memory stack in both the CFMA and the NCMA, depositing a heater on top of the flash memory stack in the NCMA without depositing a heater on top of the flash memory stack in the CFMA.

Embodiments of the present disclosure further relate to a flash memory device comprising, on a common base, a conventional flash memory cell in a conventional flash memory area (CFMA). The conventional flash memory cell comprises a CFMA flash memory stack, and a low resistivity metal gate contact directly on top of the CFMA flash memory stack. The device further comprises a neuromorphic computing memory cell in a neuromorphic computing memory area (NCMA). The neuromorphic computing memory cell comprises an NCMA flash memory stack, and a heater directly on top of the NCMA flash memory stack.

Embodiments of the present disclosure further relate to a flash memory device comprising, on a common base, a conventional flash memory cell in a conventional flash memory area (CFMA). The conventional flash memory cell comprises a CFMA flash memory stack, and a low resistivity metal gate contact directly on top of the CFMA flash memory stack. The device further comprises a neuromorphic computing memory cell in a neuromorphic computing memory area (NCMA). The neuromorphic computing memory cell comprises an NCMA flash memory stack, and a heater directly on top of the NCMA flash memory stack.

The CFMA flash memory stack and the NCMA flash memory stack each comprise, in order from bottom to top, a tunneling dielectric, a floating gate, a control dielectric, and a control gate, the tunneling dielectric comprises $HfO_2$. The floating gate comprises a p+ poly, the control dielectric comprises $HfO_2$. The control gate comprises TiN. The flash memory stack is located between, for each of the CFMA and the NCMA, a source and a drain of the respective conventional flash memory cell and the neuromorphic computing memory cell. The heater comprises TaN. The CFMA flash memory stack and the NCMA flash memory stack are adjacent to and in contact with outer spacers. The heater is separated from the outer spacers by inner spacers, the inner spacers form an opening area having a width of 100 nm or smaller, and a low resistivity metal comprising W is on top of the CFMA flash memory stack.

The above summary is not intended to describe each illustrated embodiment or every implementation of the present disclosure. Various architectures, structures, substrate materials, and process features and steps/blocks can be varied within the scope of the present invention. It should be noted that certain features cannot be shown in all figures for the sake of clarity. This is not intended to be interpreted as a limitation of any particular embodiment, or illustration, or scope of the claims. The descriptions of the various embodiments of the present invention are presented for purposes of illustration, but are not intended to be exhaustive or limited to the embodiments disclosed. Many modifications and variations will be apparent to those of ordinary skill in the art without departing from the scope and spirit of the described embodiments. The terminology used herein has been chosen to best explain the principles of the embodiments, the practical application or technical improvement over technologies found in the marketplace, or to enable others of ordinary skill in the art to understand the embodiments disclosed herein.

BRIEF DESCRIPTION OF THE DRAWINGS

The drawings included in the present application are incorporated into, and form part of, the specification. They illustrate embodiments of the present disclosure and, along with the description, explain the principles of the disclosure. The drawings are only illustrative of certain embodiments and do not limit the disclosure.

DETAILED DESCRIPTION

Figure 1A:
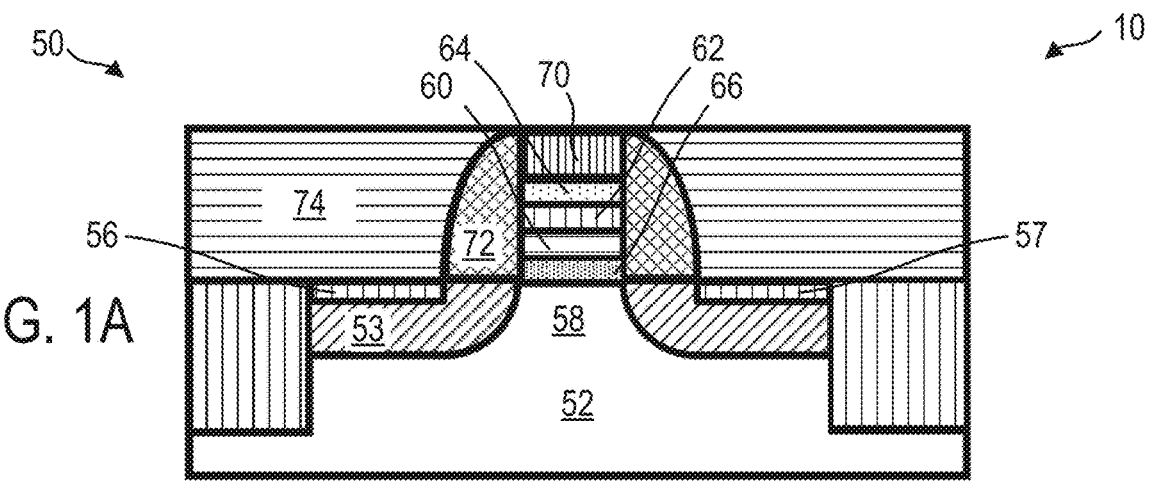
FIGS. 1A and 1B are cross-sectional views of certain base layers that are formed for a conventional flash memory area and a neuromorphic computing memory area, with the addition of a dummy gate, according to some embodiments.

The following acronyms may be used below:

TABLE 1

Acronyms

| | |
|---|---|
| ALD | atomic layer deposition |
| BEOL | back end of line |
| BOX | buried oxide |
| CD | critical dimension |
| CFMA | conventional flash memory area |
| CMP | chemical-mechanical planarization |
| CVD | chemical vapor deposition |
| ECD | electrochemical deposition |
| EOT | equivalent oxide thickness |
| HKMG | high-κ metal gate |
| HM | hard mask |
| IBE | ion beam etching |
| IC | integrated circuit |
| ILD | inter-layer dielectric |
| MBE | molecular beam epitaxy |
| MOL | middle-of-line |
| NCMA | neuromorphic computing memory area |
| PECVD | plasma enhanced chemical vapor deposition |
| PVD | physical vapor deposition |
| RA | resistance area |
| RIE | reactive ion etching |
| RTA | rapid thermal annealing |
| SHM | sacrificial hard mask |

General Chip Fabrication Techniques

Various embodiments of the present disclosure are described herein with reference to the related drawings. Alternative embodiments can be devised without departing from the scope of the present disclosure. Various connections and positional relationships (e.g., over, below, adjacent, etc.) are set forth between elements in the following description and in the drawings. These connections and/or positional relationships, unless specified otherwise, can be direct or indirect, and the present disclosure is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. The term "selective to," such as, for example, "a first element selective to a second element," means that a first element can be etched, and the second element can act as an etch stop.

For the sake of brevity, conventional techniques related to semiconductor device and integrated circuit ("IC") fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

In general, the various processes used to form a microchip that will be packaged into an IC fall into four general categories, namely, film deposition, removal/etching, semiconductor doping and patterning/lithography.

Deposition is any process that grows, coats, or otherwise transfers a material onto the wafer. Available technologies include physical vapor deposition ("PVD"), chemical vapor deposition ("CVD"), electrochemical deposition ("ECD"), molecular beam epitaxy ("MBE") and more recently, atomic layer deposition ("ALD") among others. Another deposition technology is plasma enhanced chemical vapor deposition ("PECVD"), which is a process which uses the energy within the plasma to induce reactions at the wafer surface that would otherwise require higher temperatures associated with conventional CVD. Energetic ion bombardment during PECVD deposition can also improve the film's electrical and mechanical properties.

Removal/etching is any process that removes material from the wafer. Examples include etch processes (either wet or dry), chemical-mechanical planarization ("CMP"), and the like. One example of a removal process is ion beam etching ("IBE"). In general, IBE (or milling) refers to a dry plasma etch method which utilizes a remote broad beam ion/plasma source to remove substrate material by physical inert gas and/or chemical reactive gas means. Like other dry plasma etch techniques, IBE has benefits such as etch rate, anisotropy, selectivity, uniformity, aspect ratio, and minimization of substrate damage. Another example of a dry removal process is reactive ion etching ("RIE"). In general, RIE uses chemically reactive plasma to remove material deposited on wafers. With RIE the plasma is generated under low pressure (vacuum) by an electromagnetic field. High-energy ions from the RIE plasma attack the wafer surface and react with it to remove material.

Semiconductor doping is the modification of electrical properties by doping, for example, transistor sources and drains, generally by diffusion and/or by ion implantation. These doping processes are followed by furnace annealing or by rapid thermal annealing ("RTA"). Annealing serves to activate the implanted dopants. Films of both conductors (e.g., polysilicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

Low Program Voltage Flash Memory Cell with Embedded Heater in the Control Gate

The present disclosure describes a low program voltage flash memory cell with an embedded heater in the control gate. In particular, the present disclosure describes such a flash memory cell manufactured on a chip in a neuromorphic computing area along with a cell in a conventional flash memory area.

Embedded flash memory used in the implementation of neuromorphic computing chips has historically been limited to use in an inference phase (as opposed to a training phase) for edge devices due to a high program and erase voltages required for the flash memory. Recent developments, however, provide for a low-voltage flash memory with a thin tunnel dielectric which can be effectively trained at high temperatures and, and can be used for inference at lower temperatures. However, utilization of these devices in neuromorphic chips benefits from an integrated heater solution. Initially, a high temperature environment is provided, which may be 125° C. or higher, where a lower voltage is needed for the training. Next, the chip is trained in the high temperature environment. The temperature in the environment is then lowered to normal. The low temperature can be 50° C. or lower, where low leakage current and good retention characteristics are achieved. Finally, the chip is used for inference in the low (or normal) temperature environment. The temperature assisted programming enables lower operating voltage and/or accelerated training.

The method of production according to various embodiments disclosed herein enables co-integration of the neuromorphic chip area and the conventional memory area on the same chip. The conventional memory area requiring long retention has no need for very low-voltage programming and thus may be integrated using conventional control gates. The neuromorphic memory area uses structures that enable temperature assisted programming of low-voltage flash memory cells by embedding heaters in control gates in the neuromorphic computing chip area. Heat is generated when the relatively lower programming voltage is applied to the control gate in the neuromorphic computing area, which enables the temperature-assisted low voltage training.

Figure 1B:
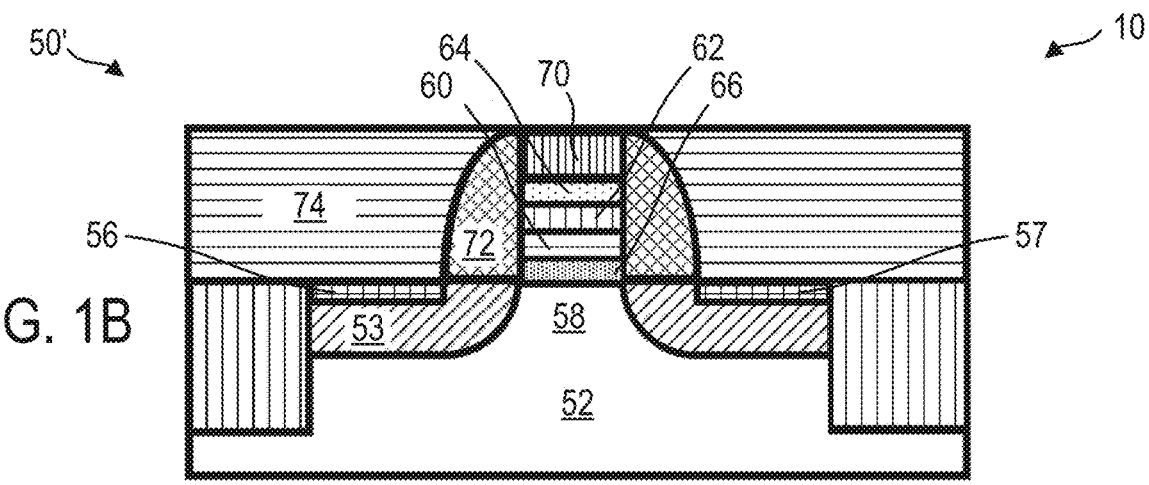

FIG. 1A is a cross section of the chip structure for a device 10, referred to herein as the base structure, after a first operation for the conventional flash memory area (CFMA) 50, and FIG. 1B is a cross section of the chip structure after the first operation for the neuromorphic computing memory area (NCMA) 50'. The conventional flash memory cell in the CFMA 50 has a long retention and uses higher programming voltages, and the neuromorphic computing memory cell in the NCMA 50' has a moderate retention and uses lower programming voltages.

Figure 7:
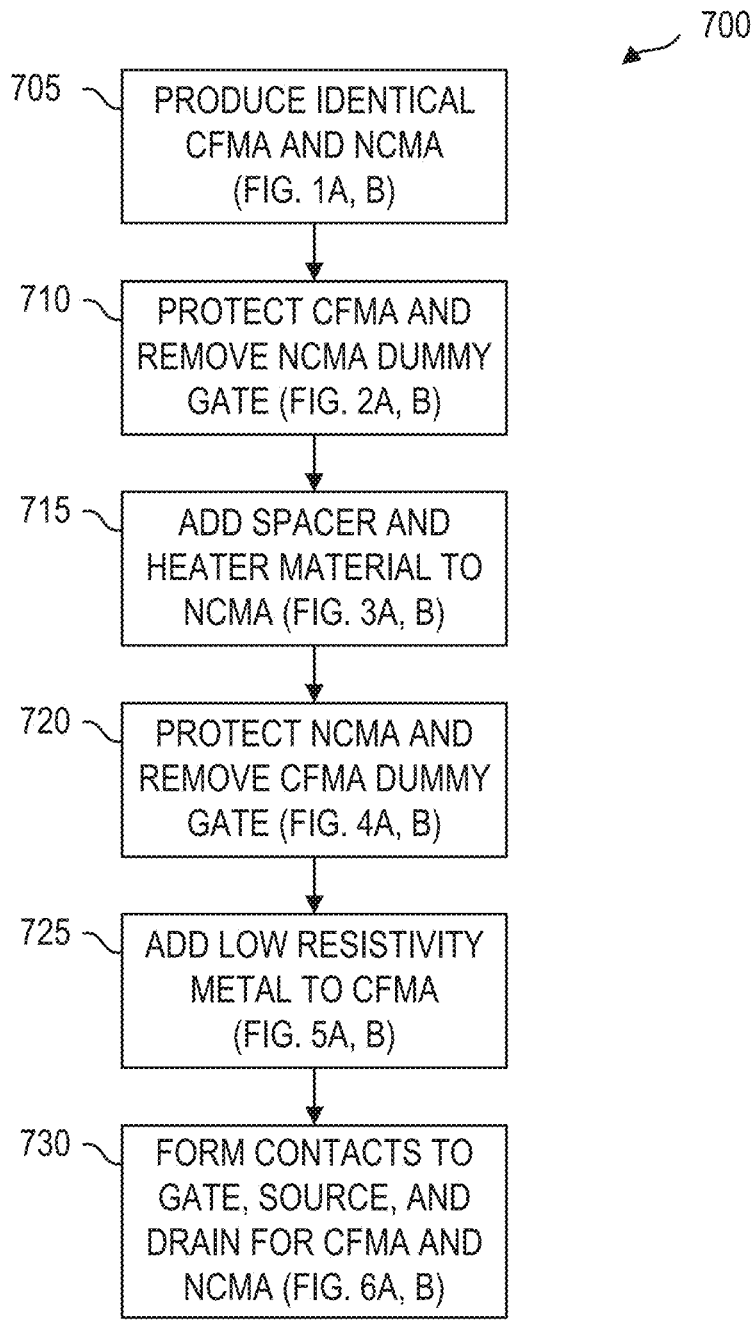
FIG. 7 is a flowchart that illustrates a process that may be used to manufacture the device described herein, according to some embodiments.

FIG. 7 is a flowchart that illustrates various operations of the process 700 for making the chip described herein. These operations will be described in conjunction with the resultant structures that are produced by them.

Background and Creation of the Base Structure

In operation 705, identical initial structures of the CFMA 50 and the NCMA 50' on the device 10 are created, as shown in FIGS. 1A and 1B. Although the CFMA 50 and NCMA 50' are shown in separate FIGs., they are both present on a same device 10 substrate. The temperature assisted training is enabled by temperature assisted programming of flash memory devices including structurally defective tunnel dielectrics. The temperature assisted programming reduces the operation voltage for a given training time and reduces the training time for a given operation voltage.

In flash memories, a single cell can be electrically programmable and a large number of cells are electrically erasable at the same time. Flash memory implementations are divided into NAND and NOR implementations. In general, flash memories employ a floating-gate transistor. The two approaches indicate how the transistors are connected and used rather than incorporating the transistors as part of digital logic as with a field programmable gate array (FPGA) or custom logic. NOR flash transistors are connected to ground and a bit line, enabling individual bits to be accessed. NOR flash provides better write endurance than NAND flash. NOR flash is usually employed where code and data can exist. Microcontrollers with on-chip flash normally incorporate NOR flash. NAND flash transistors are generally connected in groups to a word line. This allows a higher density than NOR flash. NAND flash is usually employed for block-oriented data storage. NAND flash can be less reliable than NOR from a transistor standpoint, so error detection and correction hardware or software is part of NAND storage platforms. NAND is usually employed for high-capacity data storage.

A temperature assisted approach to reduce programming voltage over conventional devices in the training phase and employ normal operation temperatures for the inference phase. The structure may include a structurally defective high-k dielectric with an equivalent oxide thickness (EOT) of 3-5 nm. The high-k dielectric may further include a high carbon concentration to increase the density of structural defects (e.g., traps) within the high-k dielectric, thus facilitating thermally-enhanced carrier transport (e.g., Frenkel-Poole conduction via traps) through the high-k dielectric. The high carbon concentration can be, e.g., greater than $10^{20}$ atoms/cm$^3$. In another example, a high temperature environment is provided (e.g., 125° C. or higher), a chip is trained, the temperature is lowered to normal (e.g., room temperature), and the chip is then used for inference in the normal temperature environment. As a result, the flash memory can be operated effectively for both training and inference.

Examples of semiconductor materials that can be used include silicon (Si), germanium (Ge), silicon germanium alloys (SiGe), silicon carbide (SiC), silicon germanium carbide (SiGeC), III-V compound semiconductors and/or II-VI compound semiconductors. III-V compound semiconductors are materials that include at least one element from Group III of the Periodic Table of Elements and at least one element from Group V of the Periodic Table of Elements. II-VI compound semiconductors are materials that include at least one element from Group II of the Periodic Table of Elements and at least one element from Group VI of the Periodic Table of Elements. In one non-limiting embodiment, Ge is used in combination with TiN. However, other combinations of materials can be readily contemplated.

The example floating gate memory switch areas 50, 50' of the device 10, shown in FIGS. 1A, 1B, are designed to function as a "normally on" transistor structure, however, "normally off" transistors can also be utilized in some embodiments. The areas 50, 50' include an electrically insulating layer, such as a buried oxide (BOX) layer, (not shown) upon which a semiconducting layer 52 is provided. Silicon dioxide is among the materials from which the insulating layer can be formed. A semiconductor layer 52 including highly doped source and drain regions 53 and a channel region 58 adjoin the semiconductor layer 52. The source and drain regions have the same conductivity type as the substrate semiconductor layer 52. The source and drain regions 53 may be n+ (highly doped) and the channel region 58 is n− (of lesser doping concentration).

When employing silicon-based channel regions, n-type doping is preferable to p-type doping due to higher electron mobility than hole mobility in silicon. Low "on" resistance is thereby obtained. A drain electrode 56 is formed directly on one of the regions 53 and a source electrode 57 is formed directly on the other of the regions 53. The semiconductor layer 52 is formed from laser-crystallized polysilicon in some embodiments.

A floating gate 60 is coupled to the channel region 58 through a tunneling dielectric layer 66. The floating gate 60 may be a highly doped p+ polysilicon layer. Other highly doped semiconductor materials can alternatively be employed to form the floating gate 60. Poly-Ge, poly-SiGe, and metal oxides are among the materials employed. The floating gate 60 may have a doping type opposite to that of the channel region 58.

The tunneling dielectric layer 66 may be a high-k dielectric layer, such as hafnium oxide (HfO$_2$) having an EOT of about 3-5 nm. A high-k dielectric material is understood as having a high dielectric constant as compared to silicon dioxide. The EOT indicates how thick a silicon oxide film would need to be to produce the same effect as the high-k material being used. Materials having larger dielectric constants enable thicker films to be used while maintaining low operation voltages. Examples of such high-k dielectrics include, but are not limited to, HfO$_2$, Al$_2$O$_3$, SrTiO$_3$, PbTiO$_3$, TiO$_2$, BaZrO$_3$, PbZrO$_3$, Ta$_2$O$_5$, SrBi$_2$Ta$_2$O$_9$, ZrO$_2$, ZrSiO$_4$, HfSiO$_4$.

A gate dielectric layer 62, such as a high-k dielectric layer, adjoins the opposite side of the floating gate 60. A gate electrode 64 adjoins the gate dielectric layer 62 and is functional as a control gate, as described further below. The floating gate 60 is coupled to the gate electrode 64 through the gate dielectric layer 62. The flash memory stack may comprise, in order from bottom to top, the tunneling dielectric 66, the floating gate 60, the control dielectric 62, and the gate electrode 64. The flash memory stack may be in direct contact on its edges with an outer spacer 72, that may comprise, e.g., SiN.

Prior to programming, the switches are normally on. No gate bias is needed for performing a read function. However, a designated gate voltage can be used if desired. A normally-on device refers to preferably no depletion (accumulation or flat-band condition) or alternatively only a partial depletion of the channel at zero control gate bias.

A positive control gate bias is applied to perform a write function. Upon application of a positive bias to the control gate electrode 64 of the example switches, electrons tunnel into the floating gate 60 from the n+ and n− regions of the semiconductor layer 52 by tunneling through the high-k dielectric layer 62. The high-k dielectric layer 62 has a high density of structural defects (e.g., traps) facilitating the transport of carriers (electrons in this example) through the high-k dielectric layer 62 by way of trap-assisted tunneling (also known as Frenkel-Poole emission). The high-k dielectric layer 62 may include carbon-containing HfO$_2$ with a carbon (C) concentration greater than $10^{20}$ atoms/cm$^3$ to produce a large density of structural defects within the high-k dielectric layer 62. In some embodiments, the structural defects include oxygen vacancies.

In one or more embodiments, the high-k dielectric contains greater than $10^{19}$ structural defects/cm$^3$. In contrast to direct (e.g. band-to-band) tunneling or field-emission, which are independent of temperature to the first order, Frenkel-Poole emission is a thermally-activated process with strong temperature dependence.

A first order expression describing Frenkel-Poole emission is given by:

$$J \propto E \exp[-q(\phi_B - \sqrt{qE/(\pi\varepsilon)})/(KT)]$$

where J is the current density through the dielectric resulting from Frenkel-Poole emission, E is the electric field across the dielectric (equal to the voltage across the dielectric divided by the thickness of the dielectric), q is the elementary charge, $\phi_B$ is the barrier height associated with localization of defects (traps) at zero electric field (E=0), e.g., the voltage barrier that an electron must cross to tunnel from one localized state (trap) to another, E is the permittivity of the dielectric, K is the Boltzmann constant, and T is the absolute temperature.

As seen from the expression, current density through the dielectric (resulting from carrier transport via Frenkel-Poole emission) can be significantly enhanced by elevating the temperature. In one example, a high-temperature environment is provided (e.g., 125° C. or higher) during the programming of the example device (e.g., performing a write function by applying a positive gate voltage as described above) to enhance electron tunneling into the floating gate 60 by enhancing Frenkel-Poole emission. As a result, the operation voltage can be reduced for a given programming time, or the programming time can be reduced for a given operation voltage, by increasing the temperature. The electrons that have tunneled into the floating gate 60 are recombined with the majority holes in the floating gate 60, adding net negative charge to the floating gate 60. Addition of negative charge to the floating gate 60 reduces the channel conduction by reducing charge accumulation in the channel and/or increasing the depletion region width in the channel. A sufficiently high negative charge on the floating gate 60 turns off the device by fully depleting the channel.

After a "write" function is performed and the positive bias on the control gate is removed (or changed to, e.g., near-zero or a negative value), the electric field across the tunneling dielectric 62 is reduced to a small or near-zero value, reducing the Frenkel-Poole emission accordingly, thus allowing the floating gate 60 to effectively retain the stored negative charge. During inference or standby conditions, retention is further enhanced by reducing the environment temperature to, e.g., room temperature.

A negative control gate bias is employed for performing an "erase" function. The erase function involves tunneling of minority holes from the semiconductor layer 54 into the floating gate 60, and tunneling of the minority electrons out of the floating gate 60 into the semiconductor layer 52. Similar to a "write" operation, an "erase" operation is facilitated by increasing the temperature, as both tunneling currents are enhanced by the increase of Frenkel-Poole emission at increased temperatures.

With respect to neuromorphic computing, a "write" operation during training as described above corresponds to synaptic depreciation, since a "write" operation reduces the channel conduction. In contrast, an "erase" operation during training as described above corresponds to synaptic potentiation, as an "erase" operation increases the channel conduction.

In one example embodiment, the example device has dimensions of 1 μm×1 μm=$10^{-8}$ cm$^2$, and high-k tunnel dielectric thickness of 3-5 nm EOT. A bias voltage of 1 V can appear across the high-k dielectric 66, e.g., when the source and drain are connected to ground (0 V), and the control gate is connected to a voltage larger than 1 V (e.g., approximately 1.2-2 V for a control dielectric thickness of 6-10 nm). This can occur, e.g., at the beginning of a "write" operation, resulting in a floating gate voltage of 1V and a channel voltage of 0V. At room temperature and a bias voltage of 1V across the high-k dielectric 66, the leakage current density through the high-k dielectric 66 is of the order of $10^{-5}$ A/cm$^2$ or lower.

In another example, at an elevated temperature of 140° C. and bias voltage of 1V across the high-k dielectric 66, the current density through the high-k dielectric 66 (dominated by Frenkel-Poole conduction) is of the order of $10^{-3}$ A/cm$^2$. This corresponds to a programming current of $10^{-3}$ A/cm$^2$× $10^{-8}$ cm$^2$=$10^{-11}$ A and a floating gate electric charge of the order of $10^{-15}$ C (assuming a floating gate voltage of 1 V). The time needed to store an electric charge of $10^{-18}$ C ($10^{-15}$ C/1000 training steps) on the floating gate is thus of the order of $10^{-18}$ C/$10^{-11}$ A=100 ns. Therefore, a training step can be performed in a time span of the order of 100 ns.

In another example, at a temperature of 230° C. and a bias voltage of 1 V across the high-k dielectric 66, the current density through the high-k dielectric 66 is of the order of $10^{-2}$ A/cm$^2$. Therefore, the time needed to store an electric charge of $10^{-18}$ C on the floating gate is of the order of 10 ns and a training step can be performed in a time span of the order of 10 ns.

In yet another example where the tunnel dielectric and the control dielectric are 3-5 nm and 6-10 nm thick, respectively, the drain and the control gate are grounded (e.g., at 0 V), and the stored charge on the floating gate is $10^{-15}$ C. The floating gate potential is approximately 0.1 V as expected from capacitive coupling between the channel, the floating gate, and the control gate.

Here, reducing the bias voltage across the high-k dielectric from 1 V to 0.1 V reduces Frenkel-Poole conduction, and, therefore, current density through the high-k dielectric is reduced by a factor of approximately $10^5$ and $10^{10}$ times at 230° C. and room-temperature, respectively. As a result, when the floating gate potential is 0.1 V after a "write" operation or in standby, conduction through the high-k dielectric at 230° C. and room-temperature is approximately $10^5$ and $10^{10}$ times lower, respectively, compared to when the floating gate potential is 1V during a "write" operation (assuming grounded source and drain during and after a "write" operation or in standby). For example, from $10^{-3}$ A/cm$^2$ to $10^{-8}$ A/cm$^2$ at 230° C., and from $10^{-5}$ A/cm$^2$ (and below) to $10^{-15}$ A/cm$^2$ (and below) at room temperature. This corresponds to a charge retention time of approximately 10 ms at 230° C., and 1000 s (and above) at room temperature.

Fabrication of the Heater Element

In both FIGS. 1A and 1B, the flash memory stack comprises the tunnel dielectric 66, the floating gate 60, the control dielectric 62, and the control gate 64). The FET is formed with a gate-first high-K metal gate (HKMG) technology flow. Next, a dummy gate 70 is placed on top of the control gate 64 for both the CFMA 50 and the NCMA 50'. The dummy gate 70 may be made of, e.g., aSi, aSiGe, and exposed using, e.g., chemical mechanical planarization (CMP). As noted above, the process and resultant structure thus far is the same for FIG. 1A (the CFMA 50), and the NCMA 50'.

Figure 2A:
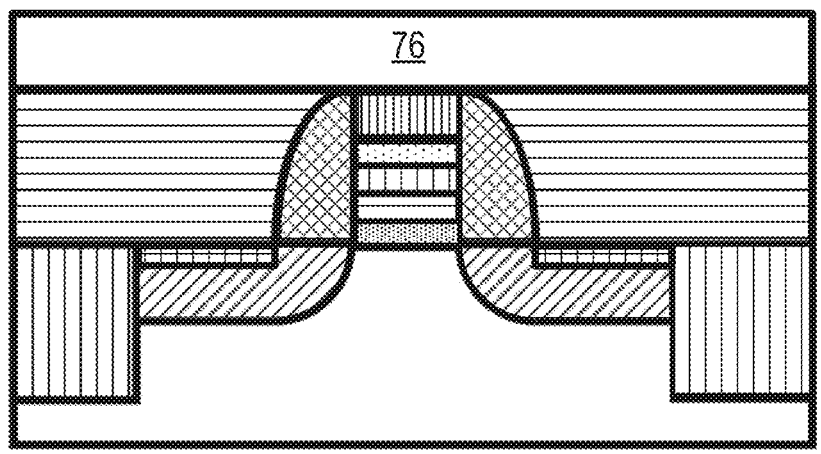
FIGS. 2A and 2B are cross-sectional views showing the addition of a hard mask to the conventional flash memory area and the removal of the dummy gate from the neuromorphic computing memory area, according to some embodiments.
Figure 2B:
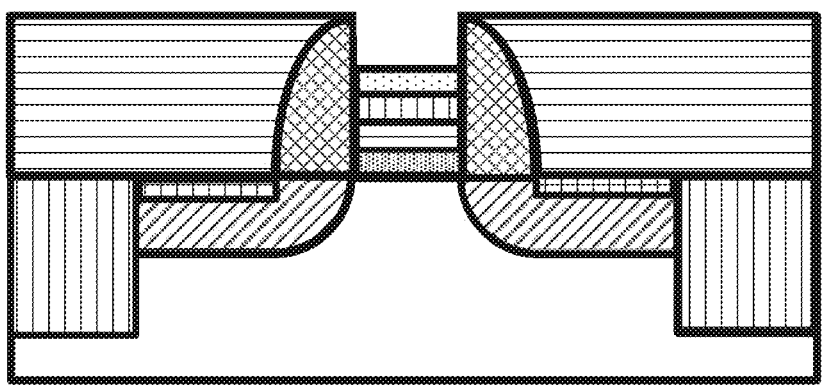

In FIG. 2A, in operation 710, for the CFMA 50, a hard mask 76 is applied on top of the dummy gate 70 to protect it while, (FIG. 2B) for the NCMA 50', the dummy gate is removed. The hard mask 76 may comprise, e.g., SiO$_2$ and may be deposited by CVD or ALD.

Figure 3A:
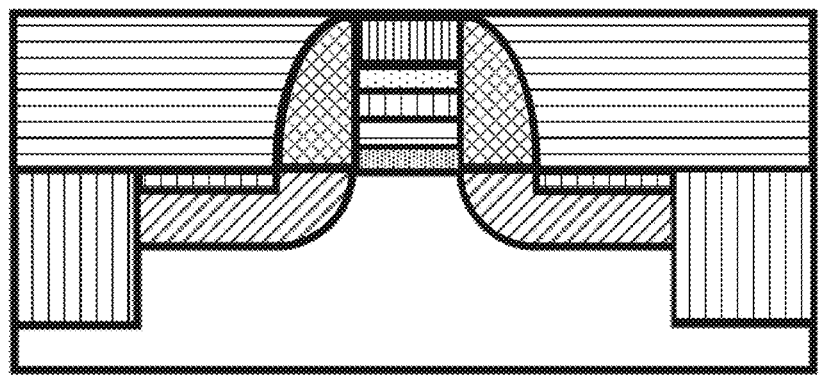
FIGS. 3A and 3B are cross-sectional views showing the addition of a heater and inner spacers to the neuromorphic computing memory area, and removal of the hard mask from the conventional flash memory area, according to some embodiments.
Figure 3B:
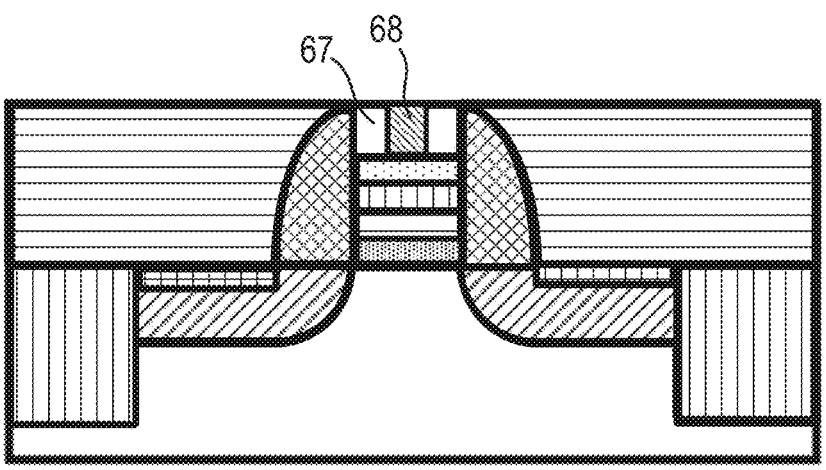

In FIG. 3B, in operation 715, inner spacers 67 are added in the NCMA 50' by applying spacer material (e.g., SiN), which may be deposited by CVD or ALD and etched back using reactive ion etching process to form the inner spacers 67. The opening area width after the inner spacers formation is typically 100 nm or smaller to ensure appropriate functionality of heater. Next, the heater 68 is deposited using a heater material, such as TaN, by a conformal deposition technique, such as CVD or ALD. FIG. 3A shows the state of the CFMA 50 after the hard mask 76 is removed from the CFMA 50 using, e.g., CMP. Once operation 715 is complete, the dummy gate 70 is exposed in the CFMA 50, and the heater 68 along with the inner spacers 67 are exposed.

Figure 4A:
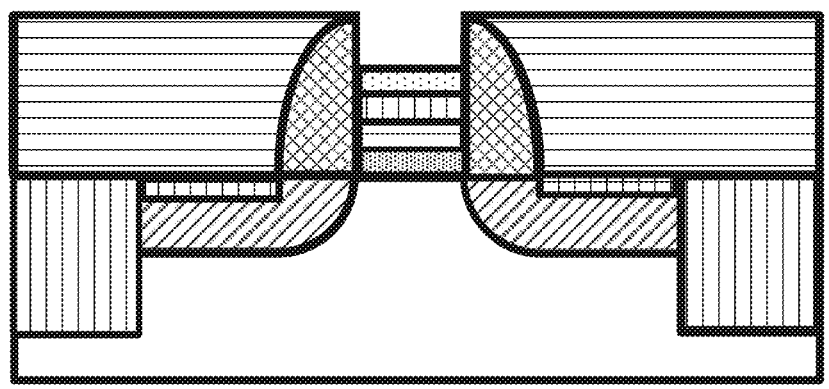
FIGS. 4A and 4B are cross-sectional views showing the addition of a hard mask to the neuromorphic computing memory area and the removal of the dummy gate from the conventional flash memory area, according to some embodiments.
Figure 4B:
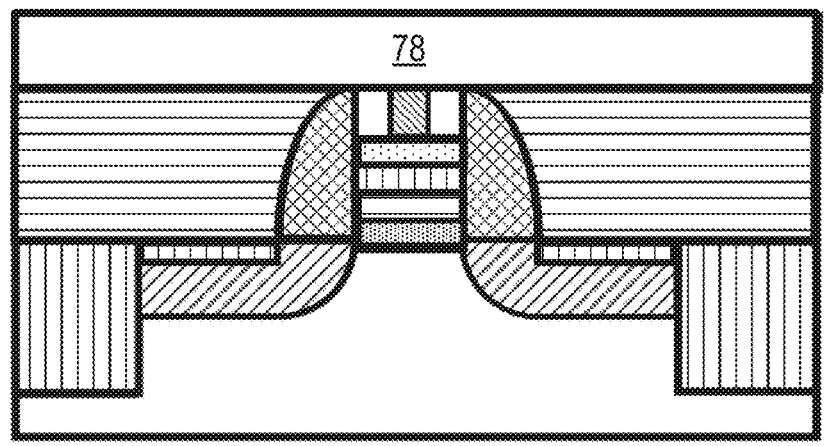

FIGS. 4A and 4B show the result of operation 720. Here, as shown in FIG. 4B, a hard mask 78, which may be made of, e.g., SiN, may be applied over the NCMA 50'. The dummy gate 70, as shown in FIG. 4A, is removed from the CFMA 50.

Figure 5A:
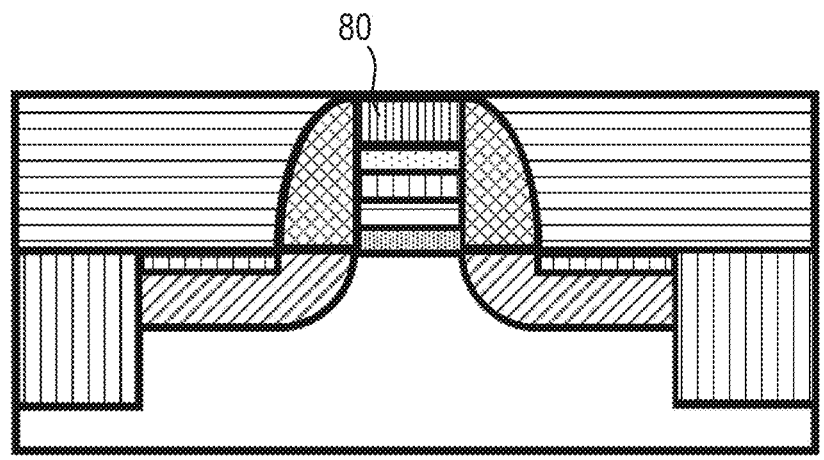
FIGS. 5A and 5B are cross-sectional views showing the addition of a low resistivity metal contact to the neuromorphic computing memory area and the removal of the hard mask from the conventional flash memory area, according to some embodiments.
Figure 5B:
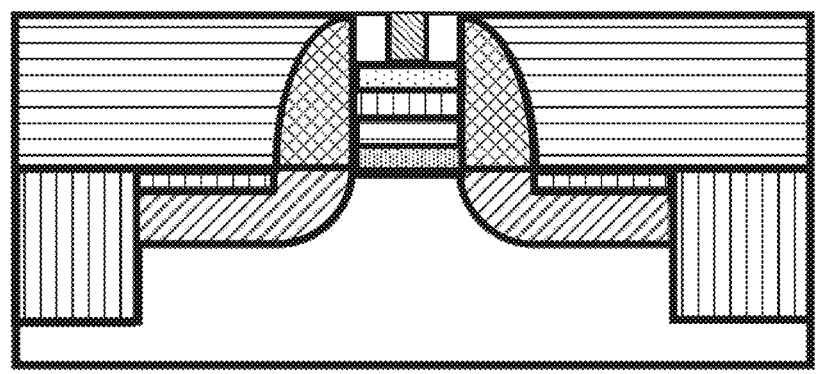

FIGS. 5A and 5B show the result of operation 725, where a low resistivity metal, such as tungsten W, is deposited by CVSD as a gate contact 80. CMP may be used to expose the low resistivity metal in the CFMA 50 and remove the hard mask 78 to expose the heater 68 in the NCMA 50'.

Figure 6A:
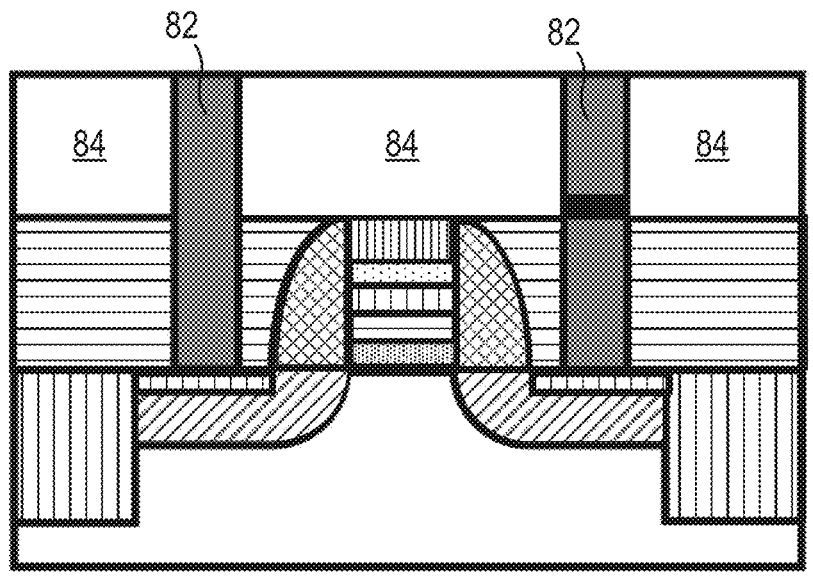
FIGS. 6A and 6B are cross-sectional views showing the addition of gate contacts and a further dielectric layer, according to some embodiments.
Figure 6B:
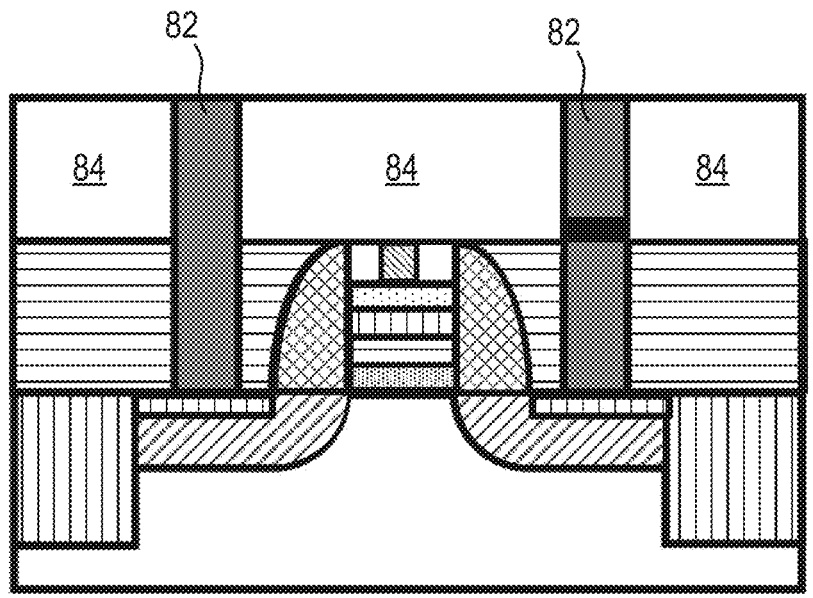

FIGS. 6A and 6B show the result of operation 730 in which a conventional CMOS middle-of-line (MOL) process is used to form contacts to the gate, source, and drain in both the CFMA 50, and the NCMA 50'.

What is claimed is:

1. A method of manufacturing, on a common device substrate, a conventional flash memory cell in a conventional flash memory area (CFMA), and a neuromorphic computing memory cell in a neuromorphic computing memory area (NCMA), the method comprising:
   providing a flash memory stack in both the CFMA and the NCMA;
   depositing a heater directly above a gate of the flash memory stack in the NCMA configured to heat the gate; and
   depositing a low resistivity metal layer at a same planar level as the heater on top of the flash memory stack in the CFMA, wherein the heater has a higher resistivity than the low resistivity metal layer.

2. The method of claim 1, wherein:
   the flash memory stack comprises, in order from bottom to top, a tunneling dielectric, a floating gate, a control dielectric, and a control gate; and
   the heater is directly on top of and in contact with the control gate.

3. The method of claim 2, wherein:
   the tunneling dielectric comprises HfO$_2$;
   the floating gate comprises a p+ poly;
   the control dielectric comprises HfO$_2$; and
   the control gate comprises TiN.

4. The method of claim 1, wherein the flash memory stack is located between, for each of the CFMA and the NCMA, a source and a drain of the respective conventional flash memory cell and the neuromorphic computing memory cell.

5. The method of claim 1, wherein the heater comprises TaN.

6. The method of claim 5, wherein the heater is deposited by a conformal deposition technique.

7. The method of claim 6, wherein the conformal deposition technique is selected from the group consisting of chemical vapor deposition (CVD) and atomic layer deposition (ALD).

8. The method of claim 1, wherein the flash memory stack is adjacent to and in contact with outer spacers.

9. The method of claim 8, wherein the heater is separated from the outer spacers by inner spacers.

10. The method of claim 9, wherein the inner spacers form an opening area having a width of 100 nm or smaller.

11. The method of claim 9, wherein the inner spacers are formed by a conformal deposition technique selected from the group consisting of chemical vapor deposition (CVD) and atomic layer deposition (ALD).

12. The method of claim 1, further comprising:
depositing a dummy gate on top of the flash memory stack in each of the CFMA and the NCMA;
depositing a hard mask on top of the dummy gate only in the CFMA; and
removing the dummy gate in the NCMA.

13. The method of claim 12, wherein the hard mask comprises SiN.

14. The method of claim 12, further comprising:
depositing a hard mask on top of the heater;
depositing a low resistivity metal on top of the flash memory stack in the CFMA; and
removing the hard mask.

15. The method of claim 14, wherein the hard mask comprises SiN.

16. The method of claim 14, wherein the low resistivity metal comprises W.

17. The method of claim 14, further comprising forming contacts to a gate, source, and drain of the memory cells in both the CFMA and NCMA.

18. A flash memory device, comprising, on a common base:
a conventional flash memory cell in a conventional flash memory area (CFMA), comprising:
a CFMA flash memory stack; and
a low resistivity metal gate contact directly on top of the CFMA flash memory stack;
a neuromorphic computing memory cell in a neuromorphic computing memory area (NCMA), comprising:
an NCMA flash memory stack; and
a heater directly on top of a gate of the NCMA flash memory stack, wherein the heater has a higher resistivity than the low resistivity metal layer.

19. The flash memory device of claim 18, wherein:
the CFMA flash memory stack and the NCMA flash memory stack each comprise, in order from bottom to top, a tunneling dielectric, a floating gate, a control dielectric, and a control gate;
the tunneling dielectric comprises $HfO_2$;
the floating gate comprises a p+ poly;
the control dielectric comprises $HfO_2$; and
the control gate comprises TiN.

20. A flash memory device, comprising, on a common base:
a conventional flash memory cell in a conventional flash memory area (CFMA), comprising:
a CFMA flash memory stack; and
a low resistivity metal gate contact directly on top of the CFMA flash memory stack;
a neuromorphic computing memory cell in a neuromorphic computing memory area (NCMA), comprising:
an NCMA flash memory stack; and
a heater directly on top of a gate of the NCMA flash memory stack;
wherein:
the CFMA flash memory stack and the NCMA flash memory stack each comprise, in order from bottom to top, a tunneling dielectric, a floating gate, a control dielectric, and a control gate;
the tunneling dielectric comprises $HfO_2$;
the floating gate comprises a p+ poly;
the control dielectric comprises $HfO_2$;
the control gate comprises TiN;
the flash memory stack is located between, for each of the CFMA and the NCMA, a source and a drain of the respective conventional flash memory cell and the neuromorphic computing memory cell;
the heater comprises TaN, and has a higher resistivity than a low resistivity metal;
the CFMA flash memory stack and the NCMA flash memory stack are adjacent to and in contact with outer spacers;
the heater is separated from the outer spacers by inner spacers;
the inner spacers form an opening area having a width of 100 nm or smaller; and
the low resistivity metal comprising W is on top of the CFMA flash memory stack.

* * * * *